US012027602B2

(12) United States Patent
Li et al.

(10) Patent No.: US 12,027,602 B2
(45) Date of Patent: Jul. 2, 2024

(54) SEMICONDUCTOR DEVICE AND METHOD FOR FORMING THE SAME

(71) Applicant: UNITED MICROELECTRONICS CORP., Hsin-Chu (TW)

(72) Inventors: Jian-Feng Li, Tainan (TW); Chia-Hua Chang, Kaohsiung (TW); Hsiang-Chieh Yen, Penghu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 155 days.

(21) Appl. No.: 17/093,549

(22) Filed: Nov. 9, 2020

(65) Prior Publication Data
US 2022/0115520 A1   Apr. 14, 2022

(30) Foreign Application Priority Data
Oct. 12, 2020   (CN) .................. 202011083391.X

(51) Int. Cl.
| | |
|---|---|
| H01L 29/66 | (2006.01) |
| H01L 21/02 | (2006.01) |
| H01L 29/20 | (2006.01) |
| H01L 29/778 | (2006.01) |

(52) U.S. Cl.
CPC .. *H01L 29/66462* (2013.01); *H01L 21/02293* (2013.01); *H01L 21/02458* (2013.01); *H01L 21/0254* (2013.01); *H01L 29/2003* (2013.01); *H01L 29/7786* (2013.01)

(58) Field of Classification Search
None
See application file for complete search history.

(56) References Cited

U.S. PATENT DOCUMENTS 6,967,122 B2 * 11/2005 Tezen .................. H01L 21/0242
                                                               438/479
7,435,666 B2    10/2008 Park
8,741,706 B2     6/2014 Kim

* cited by examiner

*Primary Examiner* — Jack S Chen
(74) *Attorney, Agent, or Firm* — Winston Hsu

(57) ABSTRACT

A high electron mobility transistor (HEMT) is disclosed. The HEMT includes a substrate, a first epitaxial layer disposed on the substrate, a second epitaxial layer disposed on the first epitaxial layer, a third epitaxial layer disposed on the second epitaxial layer, and a gate disposed on the third epitaxial layer. An upper portion of the first epitaxial layer has a plurality of first recesses. The second epitaxial layer partially fills the first recesses and surrounding a plurality of first air slits in the first recesses.

12 Claims, 9 Drawing Sheets

A ←—————————————→ A'

SEMICONDUCTOR DEVICE AND METHOD FOR FORMING THE SAME

BACKGROUND OF THE INVENTION

1. Field of the Invention

The invention relates to a semiconductor device and method for forming the same. More particularly, the invention relates to a high electron mobility transistor (HEMT) and method for forming the same.

2. Description of the Prior Art

A high electron mobility transistor (HEMT) is a new type of field effect transistor which usually includes a heterostructure formed by stacking multiple semiconductor layers. By selecting materials of the semiconductor layers, a two-dimensional electron gas (2DEG) layer may be formed at a heterojunction of the heterostructure formed by bonding two semiconductor layers having different band gaps. The two-dimensional electron gas layer may be utilized as a current channel region of the high electron mobility transistor, and is able to provide a high switching speed and a high response frequency of the high electron mobility transistor. HEMTs have been widely used in technical fields such as power converters, low noise amplifiers, radio frequency (RF) or millimeter wave (MMW).

However, there are still some technical problems for the HEMTs. For example, the lattice mismatch of semiconductor layers may cause dislocation defects in the heterostructure and reduce performance. In addition, stress induced by lattice mismatch may be accumulated in the heterostructure and may cause warpage or crack of the substrate. How to reduce the defects caused by lattice mismatch is an important issue to improve the performance and yield of the HEMTs.

SUMMARY OF THE INVENTION

In light of the above, the present invention is directed to provide a semiconductor device such as a high electron mobility transistor and a method for forming the same, which may reduce the chance of the dislocation defects in the heterostructure to extend or propagate upwardly through the layers of the heterostructure by forming multiple air slits in at least one of the semiconductor layers (the epitaxial layers, for example) of the heterostructure. Furthermore, the air slits may release the stress accumulated in the heterostructure such that warpage or crack of the substrate may be reduced.

According to an embodiment of the present invention, a high electron mobility transistor is disclosed. The high electron mobility transistor includes a substrate, a first epitaxial layer disposed on the substrate, a second epitaxial layer disposed on the first epitaxial layer, a third epitaxial layer disposed on the second epitaxial layer, and a gate disposed on the third epitaxial layer. An upper portion of the first epitaxial layer has a plurality of first recesses. The second epitaxial layer partially fills the first recesses and surrounding a plurality of first air slits in the first recesses.

According to another embodiment of the present invention, a method for forming a high electron mobility transistor is disclosed and includes the steps of providing a substrate, forming a first epitaxial layer on the substrate, forming a plurality of first recesses in an upper portion of the first epitaxial layer, forming a second epitaxial layer on the first epitaxial layer and partially filling the first recesses to seal a plurality of first air slits in the first recesses, forming a third epitaxial layer on the second epitaxial layer, and forming a gate on the third epitaxial layer.

According to still another embodiment of the present invention, a semiconductor structure disclosed. The semiconductor structure includes a first epitaxial layer, an upper portion of the first epitaxial layer having a plurality of first recesses, and a second epitaxial layer disposed on the first epitaxial layer and partially filling the first recesses and surrounding a plurality of air slits in the first recesses.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1A and FIG. 2A are top plan views.

FIG. 1B, FIG. 2B, FIG. 3 and FIG. 4 are cross-sectional views taken along the line AA' shown in FIG. 1A and FIG. 2A.

DETAILED DESCRIPTION

Figures 1A, 1B:
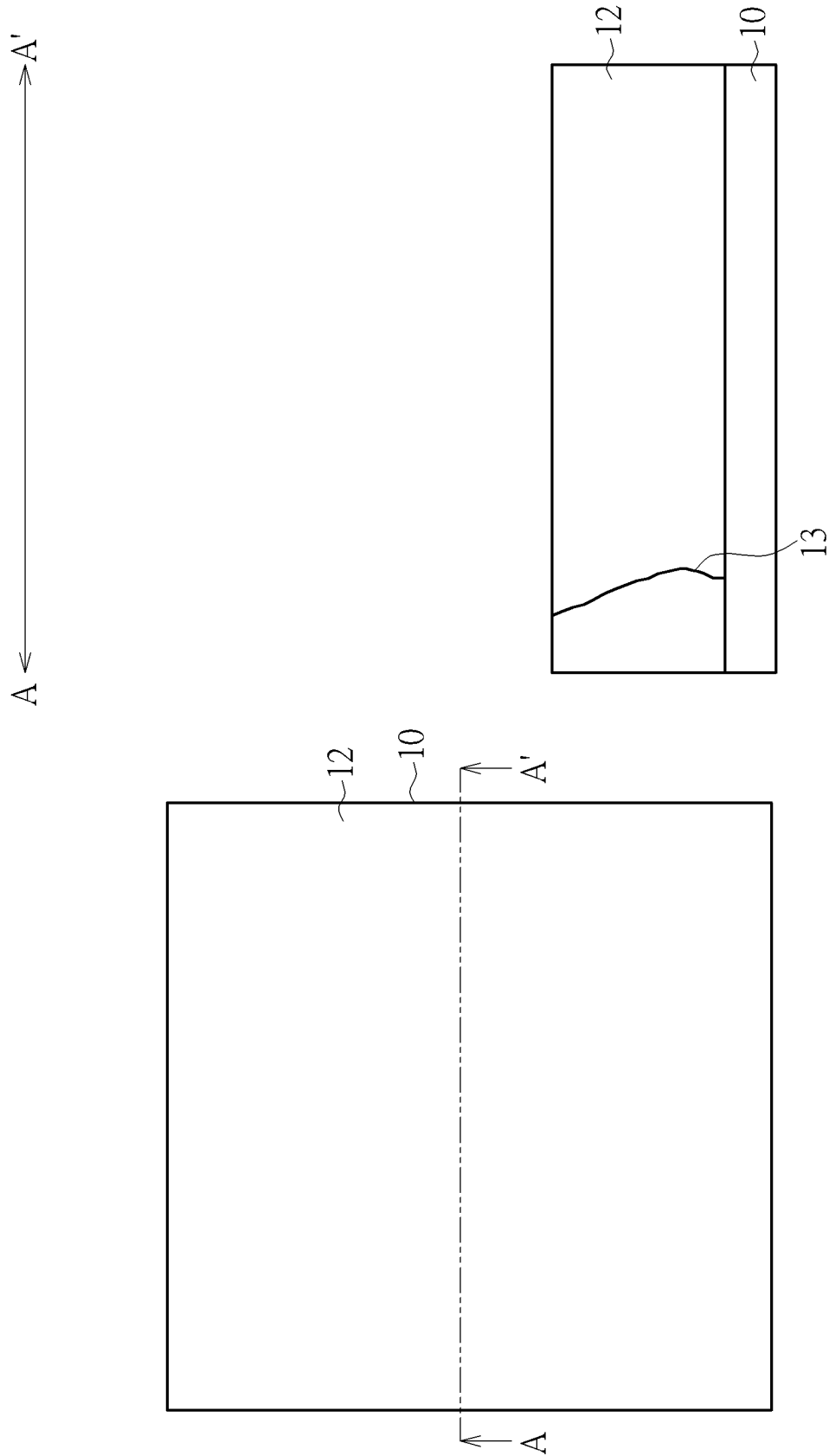
FIG. 1A, FIG. 1B, FIG. 2A, FIG. 2B, FIG. 3 and FIG. 4 are schematic diagrams illustrating the process steps of a method for forming a high electron mobility transistor according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

The high electron mobility transistor (HEMT) provided by the present invention may be a depletion mode (normally-on) transistor or an enhancement mode (normally-off) transistor. The HEMT provided by the present invention may be used in power converters, low noise amplifiers, radio frequency (RF) or millimeter wave (MMW) and other technical fields.

Figures 2A, 2B:
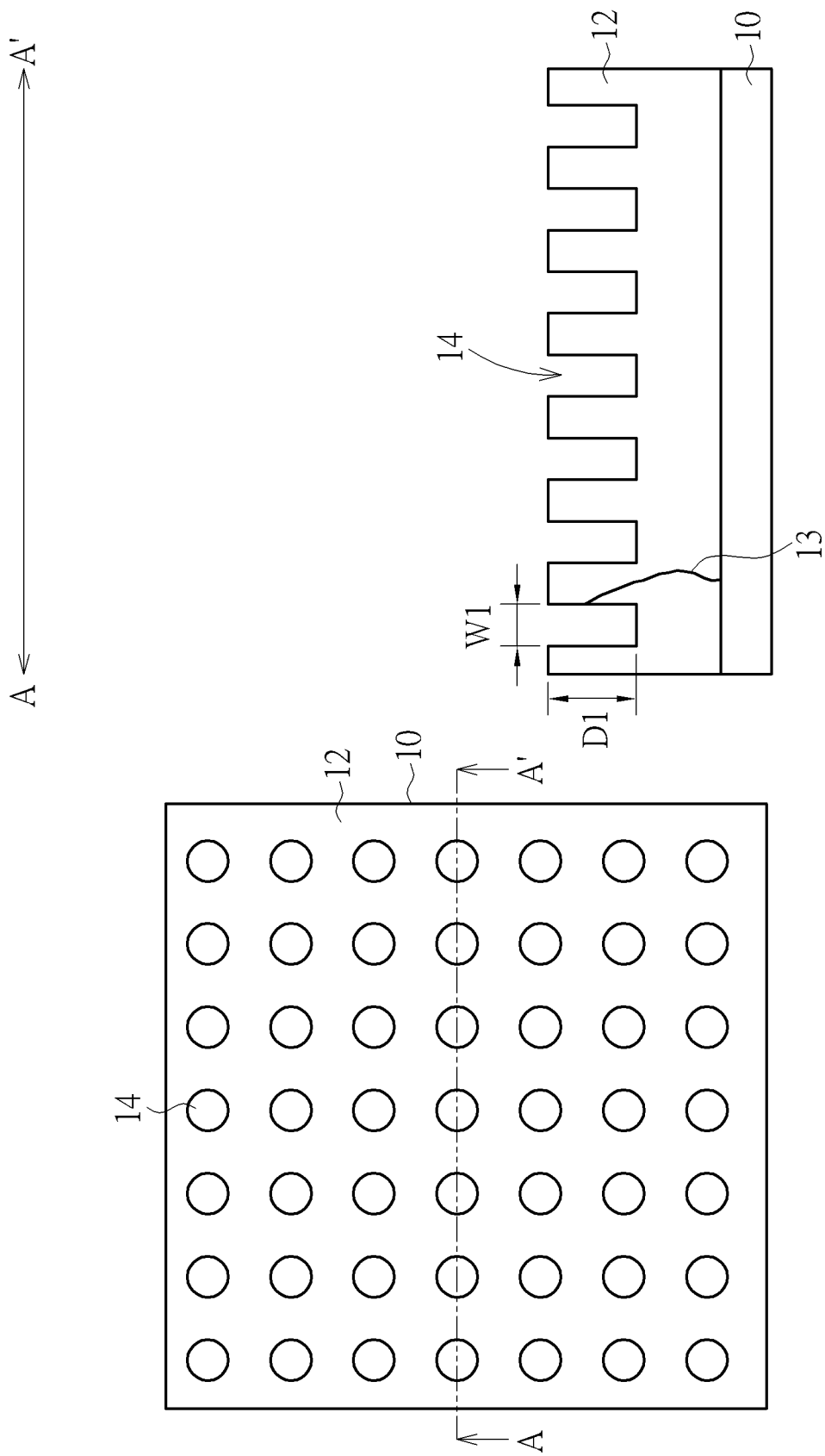

FIG. 1A, FIG. 1B, FIG. 2A, FIG. 2B, FIG. 3 and FIG. 4 are schematic diagrams illustrating the process steps of a method for forming a high electron mobility transistor according to an embodiment of the present invention. FIG. 1A and FIG. 2A are top plan views. FIG. 1B, FIG. 2B, FIG. 3 and FIG. 4 are cross-sectional views taken along the line AA' shown in FIG. 1A and FIG. 2A.

Please refer to FIG. 1A and FIG. 1B. First, a substrate 10 is provided. A first epitaxial layer 12 is formed on the substrate 10. According to some embodiments, the material of the substrate 10 may include silicon, silicon carbide (SiC), sapphire, gallium nitride (GaN), aluminum nitride (AlN), or other suitable materials, but is not limited thereto. The material of the first epitaxial layer 12 may include gallium nitride (GaN), aluminum gallium nitride (AlGaN), graded aluminum gallium nitride (graded AlGaN), aluminum indium nitride (AlInN), aluminum gallium indium nitride (AlGaInN), or aluminum nitride (AlN), or a superlattice structure formed by stacking thin layers of the above materials, but is not limited thereto. According to some embodiments, the material of the first epitaxial layer 12 is different from the substrate 10. In other words, the material of the first epitaxial layer 12 and the material of the substrate 12 comprise different compositions. For example, the material of the substrate 10 may include silicon. The material of the first epitaxial layer 12 may include aluminum gallium nitride (AlGaN).

The first epitaxial layer 12 may be formed on the substrate 10 by performing a heteroepitaxy growth process. For example, the heteroepitaxy growth process may include molecular beam epitaxy (MBE), metal-organic chemical vapor deposition (MOCVD), or hydride vapor phase deposition (HVPE), but is not limited thereto. A nucleation layer (for example, the nucleation layer 11 shown in FIG. 5) may be formed on the substrate 10 before forming the first epitaxial layer 12.

According to some embodiments of the present invention, the substrate 10 and the first epitaxial layer 12 have different lattice constants, which may cause a dislocation defect 13 to be formed in the first epitaxial layer 12. The dislocation defects 13 may be located only in the lower portion of the first epitaxial layer 12, or may extend from the lower portion of the first epitaxial layer 12 to the upper portion of the first epitaxial layer 12, as shown in FIG. 1B.

Please refer to FIG. 2A and FIG. 2B. Subsequently, a plurality of first recesses 14 are formed in the upper portion of the first epitaxial layer 12. A lithography-etching process may be performed to remove a portion of the first epitaxial layer 12 to form the first recesses 14. As shown in FIG. 2A, the first recesses 14 may respectively have a circular top-view shape and be arranged in an array. It should be understood that, in other embodiments, the first recesses 14 may have other top-view shapes, such as rectangular or a strip-shaped, but are not limited thereto. The first recesses 14 may respectively have a width W1 and a depth D1. Preferably, the aspect ratio (D1/W1) of the first recesses 14 is greater than or equal to two. As shown in FIG. 2B, in some embodiments, an end of the dislocation defect 13 may be exposed from a sidewall (or a bottom surface) of the first recesses 14.

Figure 3:
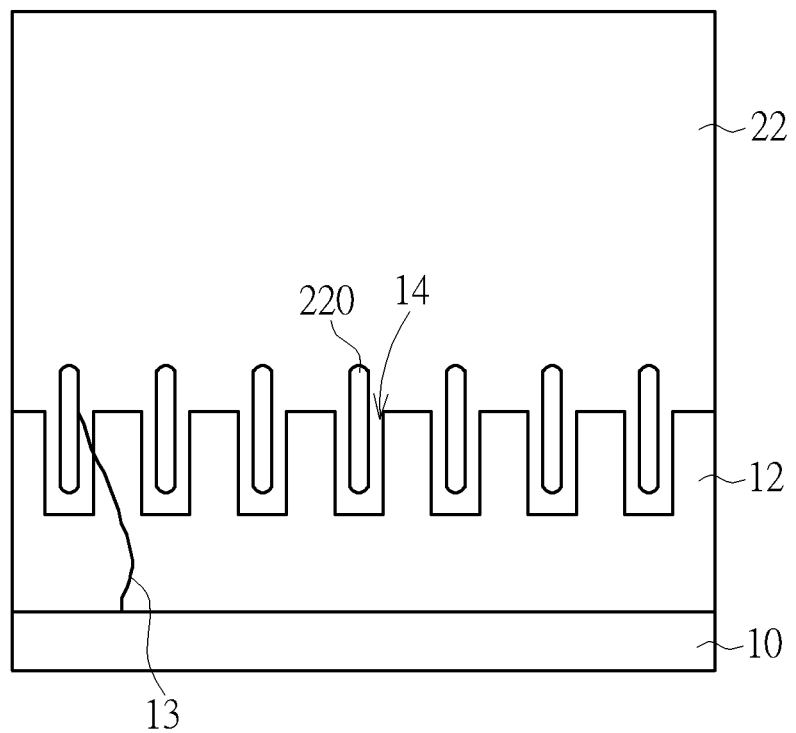

Please refer to FIG. 3. Subsequently, a second epitaxial layer 22 is formed on the first epitaxial layer 12. The second epitaxial layer 22 partially fills the first recesses 14 to seal a plurality of first air slits 220 in the first recesses 14. The second epitaxial layer 22 may be formed on the first epitaxial layer 12 by performing another heteroepitaxy growth process. According to some embodiments of the present invention, the material of the second epitaxial layer 22 may include gallium nitride (GaN), carbon doped gallium nitride (GaN:C), aluminum gallium nitride (AlGaN), aluminum indium nitride (AlInN), indium gallium nitride (InGaN), aluminum gallium indium nitride (AlGaInN), or a combination of the above, but is not limited thereto. According to some embodiments of the present invention, the material of the first epitaxial layer 12 and the material of the second epitaxial layer 22 comprise different compositions. According to some embodiments of the present invention, the material of the second epitaxial layer 22 includes gallium nitride (GaN).

It is worth noting that the epitaxial growth rate of the second epitaxial layer 22 on the upper surface of the first epitaxial layer 12 is greater than on the sidewall and bottom surface of the first recesses 14, such that first recesses 14 may be sealed to form the first air slits 220 before being filled by the second epitaxial layer 22. According to some embodiments of the present invention, the first air slits 220 may be surrounded by the second epitaxial layer 22 in the first recesses 14. According to some embodiments of the present invention, the dislocation defect 13 exposed from the first recesses 14 may propagate into the second epitaxial layer 22 on the sidewall or bottom surface of the first recesses 14 and be terminated at the first air slits 220. The first air slits 220 may prevent the dislocation defect 13 from propagating into an upper portion of the second epitaxial layer 22.

Figure 4:
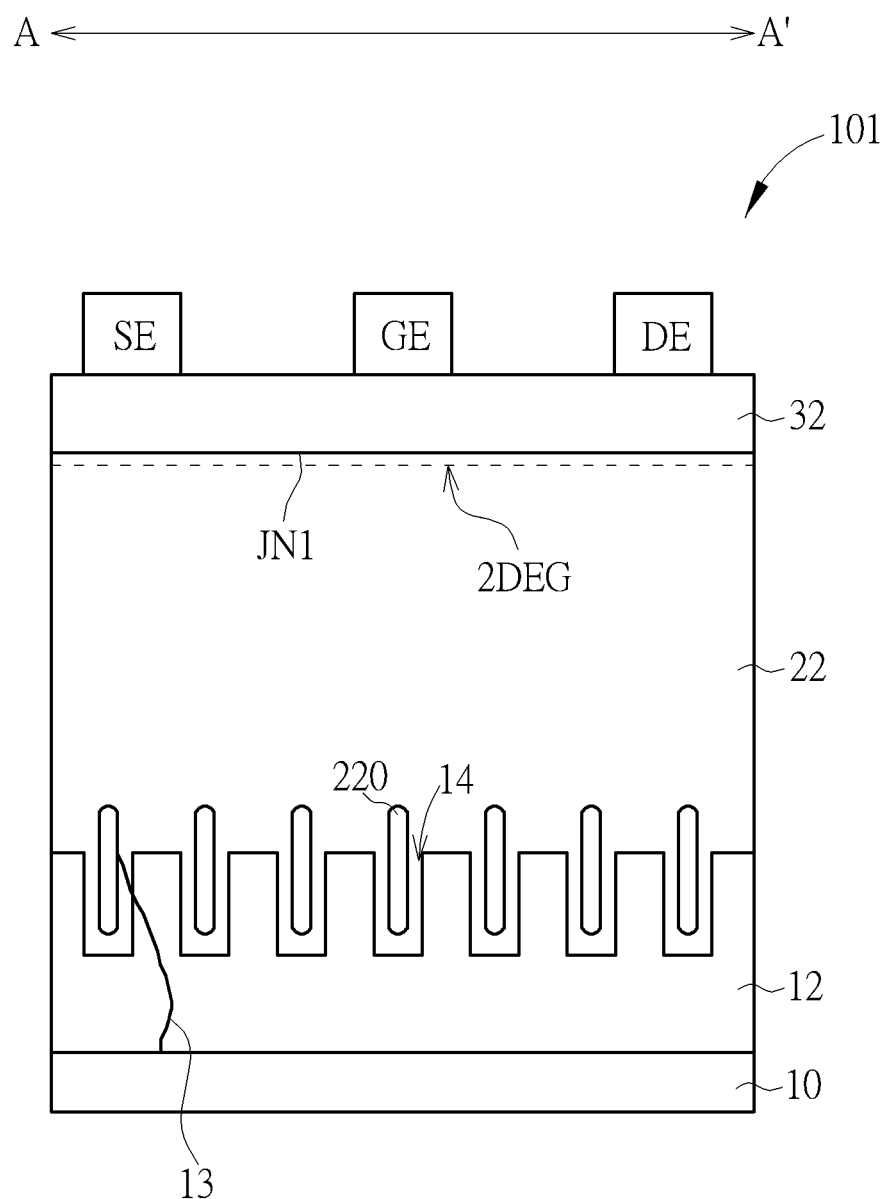

Please refer to FIG. 4. Subsequently, a third epitaxial layer 32 is formed on the second epitaxial layer 22. A gate GE and a drain DE and a source SE at two sides of the gate GE are formed on the third epitaxial layer 32. According to some embodiments of the present invention, the material of the third epitaxial layer 32 may include aluminum gallium nitride (AlGaN), aluminum indium nitride (AlInN), aluminum gallium indium nitride (AlInGaN), aluminum nitride (AlN), or a combination thereof, but is not limited thereto. According to some embodiments of the present invention, the material of the third epitaxial layer 32 includes aluminum gallium nitride (AlGaN). The third epitaxial layer 32 may be formed on the second epitaxial layer 22 by performing another heteroepitaxy growth process.

In the embodiment shown in FIG. 4, a potential well may be formed in the second epitaxial layer 22 near the junction JN1 between the third epitaxial layer 32 and the second epitaxial layer 22. The carriers (such as electrons) in the second epitaxial layer 22 may converge in the potential well, so that a two-dimensional electron gas layer 2DEG having high carrier density and high carrier mobility may be formed in the second epitaxial layer 22 immediately below the junction JN1. The two-dimensional electron gas layer 2DEG may serve as a current channel between the source SE and the drain DE, and is controlled by the gate GE.

According to some embodiments of the present invention, the gate GE may be a metal gate, and the material of the metal gate may include gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compounds of the above materials, a composite layer of the above materials or an alloy of the above materials, but is not limited thereto. According to some embodiments of the present invention, the gate GE may be a metal-semiconductor gate which includes a semiconductor layer (not shown) and a metal layer (not shown) on the semiconductor layer. The semiconductor layer of the metal-semiconductor gate may be a p-type gallium nitride (p-GaN) layer having dopants such as magnesium (Mg), iron (Fe) or other suitable p-type dopants. The metal layer of the metal-semiconductor gate may include the materials used for the aforementioned metal gate. The source SE and the drain DE may include metal materials, such as the materials used for the aforementioned metal gates.

According to some embodiments of the present invention, a dielectric layer (not shown) may be disposed between the gate GE and the third epitaxial layer 32. The material of the dielectric layer may include aluminum nitride (AlN), aluminum oxide (Al2O3), boron nitride (BN), silicon nitride (Si3N4), silicon oxide (SiO2), zirconia (ZrO2), hafnium oxide (HfO2), lanthanum oxide (La2O3), lutetium oxide (Lu2O3), lanthanum oxide (LaLuO3), high-k dielectric materials, other suitable dielectric materials, or a combination thereof, but is not limited thereto.

Please still refer to FIG. 4. The high electron mobility transistor 101 according to an embodiment of the present invention includes a substrate 10. A first epitaxial layer 12, a second epitaxial layer 22, and a third epitaxial layer 32 are successively disposed on the substrate 10. The upper portion of the first epitaxial layer 12 includes a plurality of first recesses 14. The second epitaxial layer 22 partially fills the first recesses 14 and surrounds the first air slits 220 in the first recesses 14. The gate GE and the source SE and drain DE disposed on two sides of the gate GE are provided on the third epitaxial layer 32 to control the conduction of the two-dimensional electron gas layer 2DEG near the junction JN1 between the third epitaxial layer 32 and the second epitaxial layer 22. In the embodiment, the first epitaxial layer 12 may be a buffer layer (or a lower barrier layer) of the high electron mobility transistor 101, and is used as a transition region between the substrate 10 and the second epitaxial layer 22. The first epitaxial layer 12 may provide stress to the second epitaxial layer 22 disposed thereon. The second epitaxial layer 22 may be a channel layer of the high electron mobility transistor 101, and is the main region for providing carriers of the two-dimensional electron gas layer 2DEG The third epitaxial layer 32 may be an upper barrier layer of the high electron mobility transistor 101, and is bonded to the second epitaxial layer 22 to induce the potential well for forming the two-dimensional electron gas layer 2DEG The present invention may reduce the chance of the dislocation defects 13 to propagate upwardly from the lower portion of the second epitaxial layer 22 by forming a plurality of first recesses 14 in the upper portion of the first epitaxial layer 12 and a plurality of first air slits 220 in the first recesses 14. Furthermore, the first air slits 220 may release the stress accumulated in the heterostructure to reduce warpage or crack of the substrate 10. An improved yield and a better performance of the high electron mobility transistor 101 may be obtained.

According to some embodiments of the present invention, the first epitaxial layer 12, the second epitaxial layer 22, and the third epitaxial layer 32 may respectively have a single-layered structure, a multi-layered structure, or a superlattice structure formed by stacking semiconductor thin layers. By selecting the materials and adjusting the thickness of the semiconductor thin layers, the band structure, the strength of the polarization field and/or the carrier distribution near the junction JN1 may be adjusted, thereby adjusting the carrier distribution and carrier mobility of the two-dimensional electron gas layer 2DEG to meet product performance requirement.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
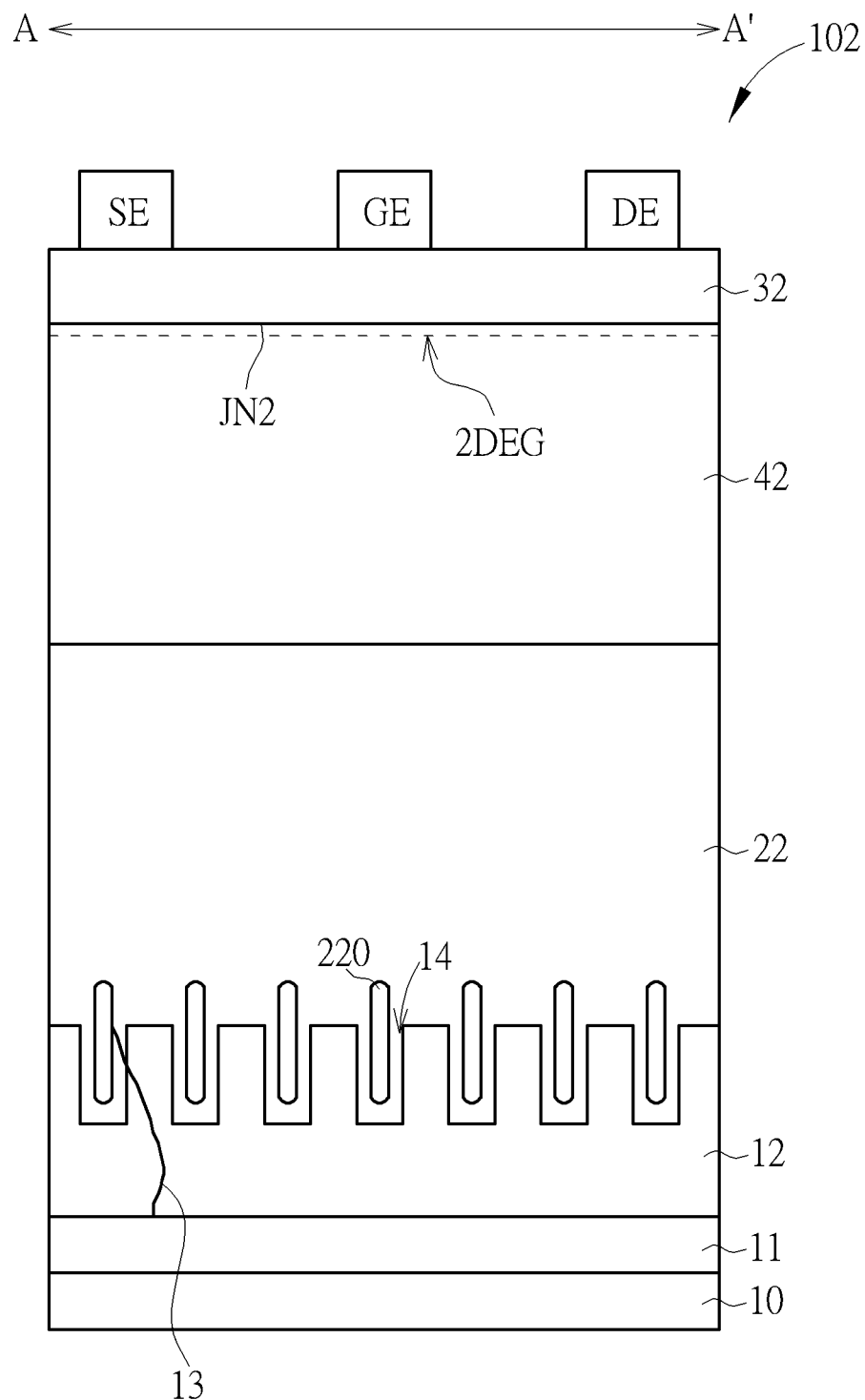
FIG. 5 is a schematic cross-sectional view of a high electron mobility transistor according to an embodiment of the present invention.

Please refer to FIG. 5, which is a schematic cross-sectional view of a high electron mobility transistor 102 according to an embodiment of the present invention. A main difference between the high electron mobility transistor 102 shown in FIG. 5 and the high electron mobility transistor 101 shown in FIG. 4 is that the high electron mobility transistor 102 further include a fourth epitaxial layer 42 disposed between the second epitaxial layer 22 and the third epitaxial layer 32. In the high electron mobility transistor 102, the first epitaxial layer 12 and the second epitaxial layer 22 may collectively be used as the buffer layer (or a lower barrier layer), and the fourth epitaxial layer 42 is used as the channel layer. That is, the two-dimensional electron gas layer 2DEG is formed in the fourth epitaxial layer 42 near the junction JN2 between the fourth epitaxial layer 42 and the third epitaxial layer 32. The material of the second epitaxial layer 22 and the material of the fourth epitaxial layer 42 comprise different compositions. According to some embodiments of the present invention, the material of the second epitaxial layer 22 includes carbon doped gallium nitride (GaN:C), and the material of the fourth epitaxial layer 42 includes gallium nitride (GaN).

Figure 6:
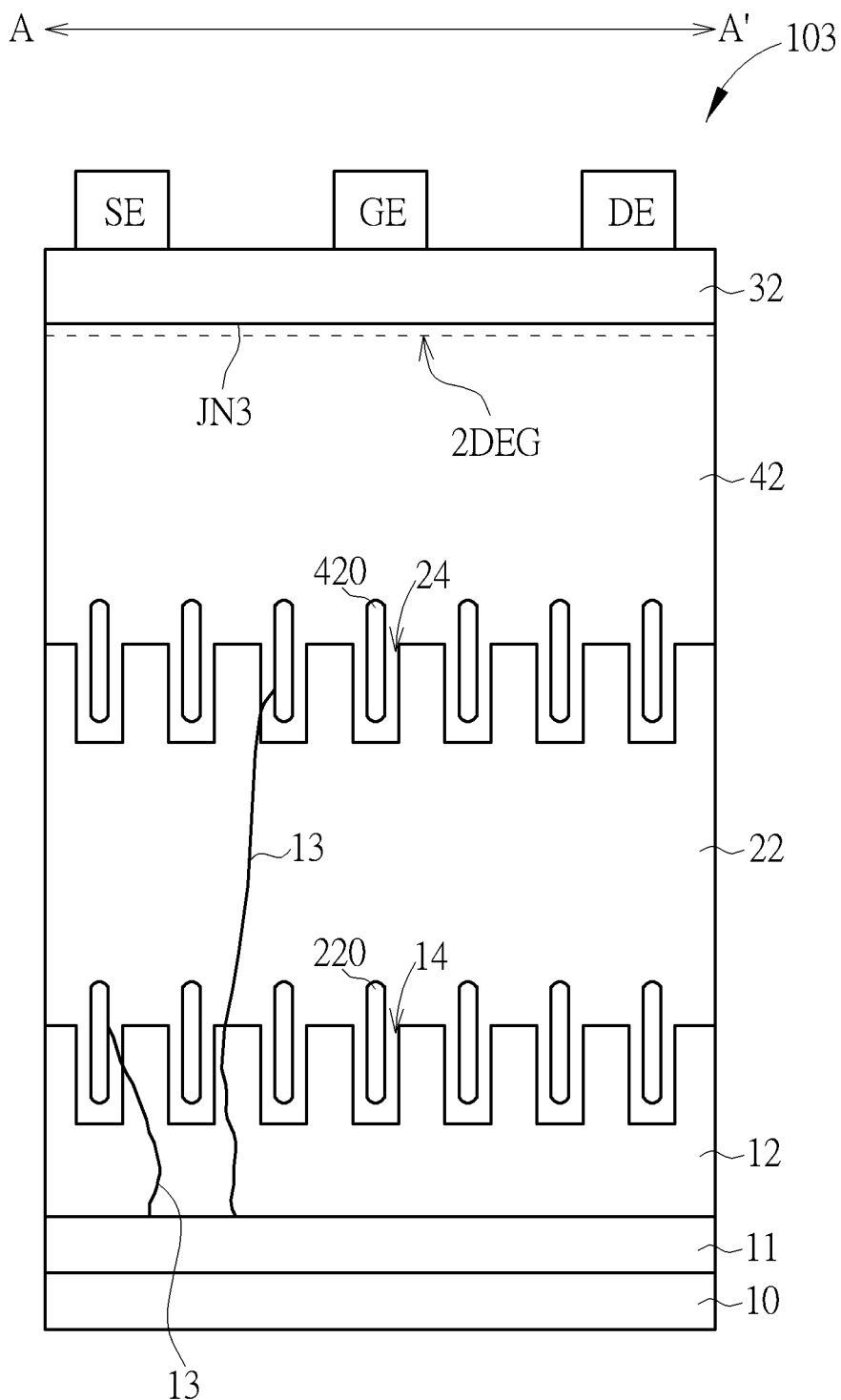
FIG. 6 is a schematic cross-sectional view of a high electron mobility transistor according to an embodiment of the present invention.

Please refer to FIG. 6, which is a schematic cross-sectional view of a high electron mobility transistor 103 according to an embodiment of the present invention. A main difference between the high electron mobility transistor 103 shown in FIG. 6 and the high electron mobility transistor 102 shown in FIG. 5 is that a plurality of second recesses 24 are formed in an upper portion of the second epitaxial layer 22. It is worth noting that the epitaxial growth rate of the fourth epitaxial layer 42 on the upper surface of the second epitaxial layer 22 is greater than on the sidewall and bottom surface of the second recesses 24, such that the fourth epitaxial layer 42 partially fills the second epitaxial layer 22 to seal and surround a plurality of second air slits 420 in the second recesses 24. As shown in FIG. 6, the second air slits 420 may reduce the chance of the dislocation defects 13 to propagate upwardly from the lower portion of the fourth epitaxial layer 42. The second air slits 420 may help to release more stress in the heterostructure.

Figure 7:
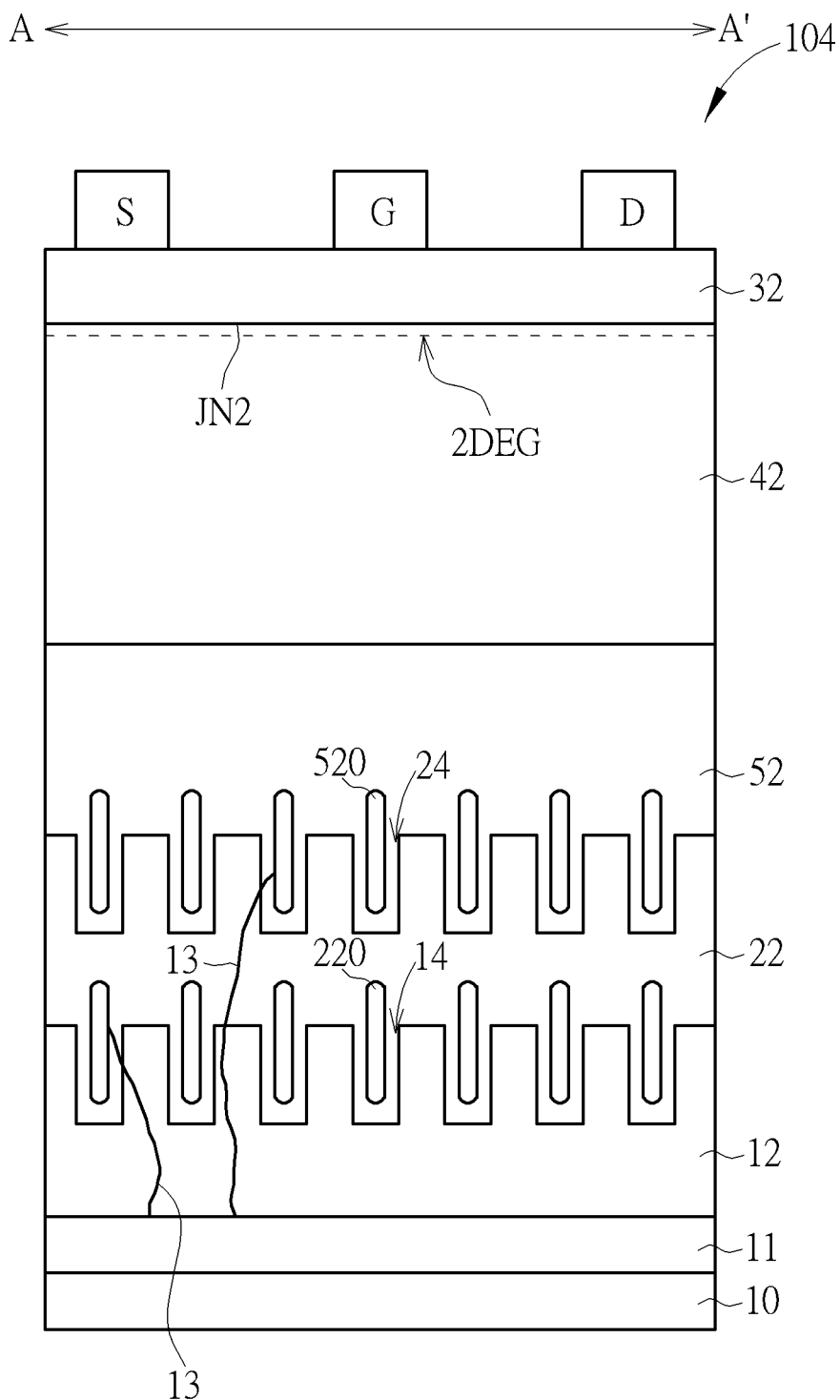
FIG. 7 is a schematic cross-sectional view of a high electron mobility transistor according to an embodiment of the present invention.

Please refer to FIG. 7, which is a schematic cross-sectional view of a high electron mobility transistor 104 according to an embodiment of the present invention. A main difference between the high electron mobility transistor 104 shown in FIG. 7 and the high electron mobility transistor 103 shown in FIG. 6 is that the high electron mobility transistor 104 further include a fifth epitaxial layer 52 disposed between the second epitaxial layer 22 and the fourth epitaxial layer 42. In the high electron mobility transistor 104, the first epitaxial layer 12, the second epitaxial layer 22, and the fifth epitaxial layer 52 may collectively be used as the buffer layer (or a lower barrier layer), and the fourth epitaxial layer 42 is used as the channel layer. The material of the second epitaxial layer 22 and the material of the fifth epitaxial layer 52 comprise the same composition. According to some embodiments of the present invention, the material of the second epitaxial layer 22 and the material of the fifth epitaxial layer 52 include carbon doped gallium nitride (GaN:C). As shown in FIG. 7, the fifth epitaxial layer 52 may have an epitaxial growth rate on the upper surface of the second epitaxial layer 22 greater than on the sidewall and bottom surface of the second recesses 24, such that the epitaxial layer 52 include partially fills the second recesses 24 in the upper portion of the second epitaxial layer 22 to seal and surround the second air slits 520 in the second recesses 24. As shown in FIG. 7, the second air slits 520 may reduce the chance of the dislocation defects 13 to propagate upwardly from the lower portion of the fifth epitaxial layer 52. The second air slits 520 may help to release more stress in the heterostructure.

Figure 8:
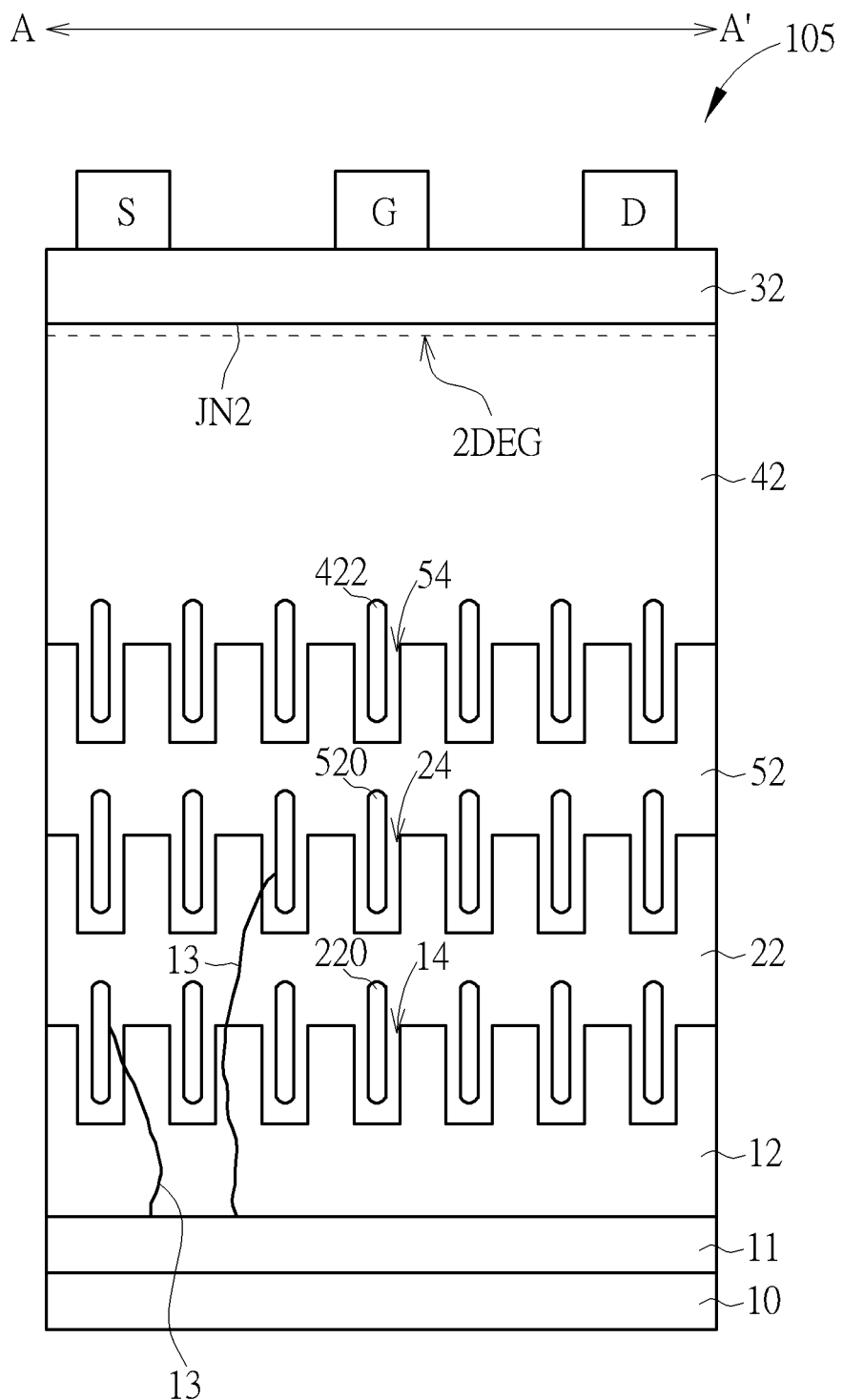
FIG. 8 is a schematic cross-sectional view of a high electron mobility transistor according to an embodiment of the present invention.

Please refer to FIG. 8, which is a schematic cross-sectional view of a high electron mobility transistor 105 according to an embodiment of the present invention. A main difference between the high electron mobility transistor 105 shown in FIG. 8 and the high electron mobility transistor 104 shown in FIG. 7 is that a plurality of third recesses 54 are formed in the upper portion of the fifth epitaxial layer 52 of the high electron mobility transistor 105. The fourth epitaxial layer 42 may have an epitaxial growth rate on the upper surface of the fifth epitaxial layer 52 greater than on the sidewall and bottom surface of the third recesses 54, such that the fourth epitaxial layer 42 may partially fill the third recesses 54 to seal and surround a plurality of third air slits 422 in the third recesses 54. The third recesses 54 may further reduce the chance of the dislocation defects 13 to propagate upwardly and release more stress in the heterostructure.

Figures 9A, 9B:
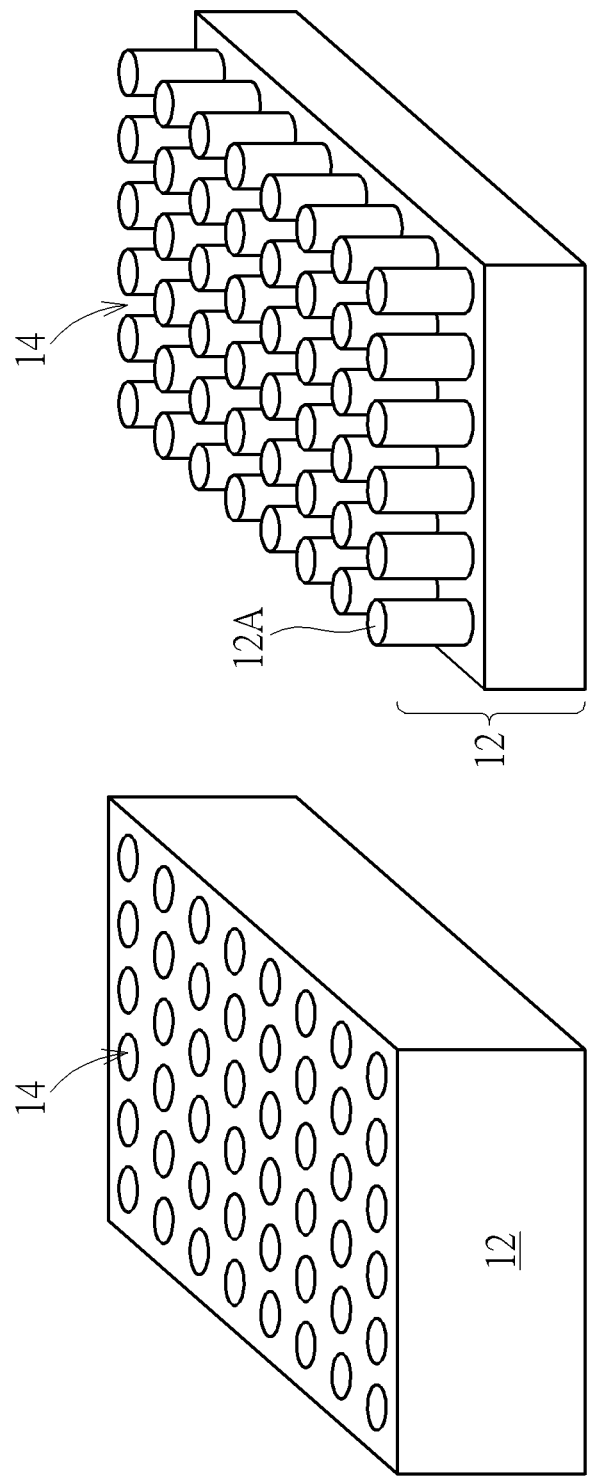
FIG. 9A and FIG. 9B are schematic isometric views showing some examples of the first recesses.

FIG. 9A and FIG. 9B are schematic isometric views showing some examples of the first recesses 14. Please refer to FIG. 9A. The first recesses 14 may be formed in the upper portion of the first epitaxial layer 12 and separated from each other. Please refer to FIG. 9B. The first recesses 14 may be connected to each other and surround the island structures 12A in the upper portion of the first epitaxial layer 12. It should be understood that the second recess 24 and/or the third recesses 54 may have shapes similar to the examples shown in FIG. 9A and FIG. 9B.

In conclusion, the novel high electron mobility transistor provided by the present invention may reduce the chance of the dislocation defects to extend or propagate upwardly by forming air slits in at least one of the epitaxial layers of the heterostructure. Additionally, the air slits may release the stress in the heterostructure. An improved yield and a better performance of the high electron mobility transistor may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high electron mobility transistor, comprising:
   a substrate having a front surface, wherein the front surface is entirely a planar surface;
   a first epitaxial layer disposed on the front surface of the substrate and in direct contact with the front surface, wherein an upper portion of the first epitaxial layer has a plurality of first recesses to form a continuous and battlement-shaped top surface of the first epitaxial layer;
   a second epitaxial layer disposed on the first epitaxial layer and partially filling the first recesses and surrounding a plurality of first air slits in the first recesses, wherein a thickness of the first epitaxial layer and a thickness of the second epitaxial layer are both larger than a depth of the first recesses;
   a third epitaxial layer disposed on the second epitaxial layer; and
   a gate disposed on the third epitaxial layer.
2. The high electron mobility transistor according to claim 1, wherein a material of the substrate, a material of the first epitaxial layer and a material of the second epitaxial layer comprise different compositions.
3. The high electron mobility transistor according to claim 2, wherein the material of the substrate comprises silicon, the material of the first epitaxial layer comprises AlGaN, and the material of the second epitaxial layer comprises GaN.
4. The high electron mobility transistor according to claim 1, wherein a material of the third epitaxial layer comprises AlGaN.
5. The high electron mobility transistor according to claim 1, wherein the first recesses have an aspect ratio greater than or equal to two.
6. The high electron mobility transistor according to claim 1, further comprising a fourth epitaxial layer disposed between the second epitaxial layer and the third epitaxial layer.
7. The high electron mobility transistor according to claim 6, wherein the second epitaxial layer comprises carbon doped GaN, and the fourth epitaxial layer comprises GaN.
8. The high electron mobility transistor according to claim 6, wherein:
   an upper portion of the second epitaxial layer comprises a plurality of second recesses; and
   the fourth epitaxial layer partially fills the second recesses and surrounds a plurality of second air slits in the second recesses.
9. The high electron mobility transistor according to claim 6, further comprising a fifth epitaxial layer disposed between the second epitaxial layer and the fourth epitaxial layer, wherein the a material of the fifth epitaxial layer and a material of the second epitaxial layer comprise a same composition.
10. The high electron mobility transistor according to claim 9, wherein the material of the second epitaxial layer and the material of the fifth epitaxial layer comprises carbon doped GaN.

11. The high electron mobility transistor according to claim 9, wherein:
- an upper portion of the second epitaxial layer comprises a plurality of second recesses; and
- the fifth epitaxial layer partially fills the second recesses and surrounds a plurality of second air slits in the second recesses.

12. The high electron mobility transistor according to claim 9, wherein:
- an upper portion of the fifth epitaxial layer comprises a plurality of third recesses; and
- the fourth epitaxial layer partially fills the third recesses and surrounds a plurality of third air slits in the third recesses.

* * * * *